(12) United States Patent
Höppel et al.

(10) Patent No.: US 9,601,663 B2
(45) Date of Patent: Mar. 21, 2017

(54) LIGHT-EMITTING DIODE CHIP

(75) Inventors: Lutz Höppel, Alteglofsheim (DE);
Norwin von Malm, Nittendorf (DE);
Matthias Sabathil, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/819,873

(22) PCT Filed: Aug. 17, 2011

(86) PCT No.: PCT/EP2011/064185
§ 371 (c)(1),
(2), (4) Date: Apr. 11, 2013

(87) PCT Pub. No.: WO2012/028460
PCT Pub. Date: Mar. 8, 2012

(65) Prior Publication Data
US 2014/0145227 A1    May 29, 2014

(30) Foreign Application Priority Data

Sep. 2, 2010 (DE) .................. 10 2010 036 180

(51) Int. Cl.
*H01L 33/00* (2010.01)
*H01L 33/22* (2010.01)
(52) U.S. Cl.
CPC .......... *H01L 33/22* (2013.01); *H01L 33/0079* (2013.01)
(58) Field of Classification Search
CPC ...... H01L 33/0079; H01L 33/22; H01L 33/58
(Continued)

(56) References Cited

U.S. PATENT DOCUMENTS 7,435,998 B2 * 10/2008 Kondo ................ H01L 21/6835
257/100
7,446,344 B2   11/2008 Fehrer et al.
(Continued)

FOREIGN PATENT DOCUMENTS

DE        199 45 465       4/2000
DE    10 2007 002 416 A1  10/2007
(Continued)

OTHER PUBLICATIONS

Wei Chih Peng et al., "Improved luminance intensity of InGaN—GaN light-emitting diode by roughening both the p-GaN surface and the undoped-GaN surface," Applied Physics Letters, vol. 89, 2006, pp. 041116-1-041116-3.
(Continued)

*Primary Examiner* — Trung Q Dang
*Assistant Examiner* — Patricia Reddington
(74) *Attorney, Agent, or Firm* — DLA Piper LLP (US)

(57) ABSTRACT

A light-emitting diode chip includes a semiconductor body including a radiation-generating active region, at least two contact locations electrically contacting the active region, a carrier and a connecting medium arranged between the carrier and the semiconductor body, wherein the semiconductor body includes roughening on outer surfaces facing the carrier, the semiconductor body mechanically connects to the carrier by the connecting medium, the connecting medium locally directly contacts the semiconductor body and the carrier, and the at least two contact locations are arranged on the upper side of the semiconductor body facing away from the carrier.

19 Claims, 9 Drawing Sheets

(58) Field of Classification Search
USPC .......................................................... 257/98
See application file for complete search history.

(56) References Cited

U.S. PATENT DOCUMENTS

| | | | |
|---|---|---|---|
| 8,120,049 B2 | 2/2012 | Matsuo et al. | |
| 8,563,999 B2* | 10/2013 | Yoon et al. | 257/98 |
| 8,598,613 B2* | 12/2013 | Kim | 257/99 |
| 8,633,501 B2* | 1/2014 | Ou et al. | 257/98 |
| 8,658,450 B2* | 2/2014 | Nago et al. | 438/46 |
| 8,669,129 B2* | 3/2014 | Miki et al. | 438/47 |
| 2005/0287687 A1 | 12/2005 | Liao et al. | |
| 2006/0275617 A1* | 12/2006 | Miyoshi et al. | 428/448 |
| 2008/0149955 A1* | 6/2008 | Nakamura | H01L 33/32 257/96 |
| 2009/0014747 A1* | 1/2009 | Shiue | H01L 33/0079 257/99 |
| 2009/0127575 A1* | 5/2009 | Horng | H01L 33/0079 257/98 |
| 2010/0084679 A1* | 4/2010 | Hsieh | H01L 33/22 257/98 |
| 2010/0096657 A1* | 4/2010 | Ou | H01L 33/22 257/98 |
| 2010/0120183 A1* | 5/2010 | Kim | H01L 33/0079 438/29 |
| 2010/0308355 A1* | 12/2010 | Hsieh et al. | 257/98 |
| 2011/0108872 A1* | 5/2011 | Kim | 257/98 |
| 2013/0015461 A1* | 1/2013 | Lin | 257/76 |

FOREIGN PATENT DOCUMENTS

| | | |
|---|---|---|
| DE | 10 2007 004 302 A1 | 4/2008 |
| DE | 10 2008 009 642 A1 | 8/2008 |
| DE | 10 2008 039 790 A1 | 3/2010 |
| JP | 7-86470 A | 3/1995 |
| JP | 11-026811 | 1/1999 |
| JP | 2004-95941 | 3/2004 |
| JP | 2006-251212 | 9/2006 |
| JP | 2008-205468 | 9/2008 |
| JP | 2010-103149 | 5/2010 |
| KR | 10-0950137 | 3/2010 |
| KR | 10-2010-0077152 | 7/2010 |
| WO | 2009/008300 A1 | 1/2009 |
| WO | 2009/039212 A1 | 3/2009 |

OTHER PUBLICATIONS

Chia-Feng Lin et al., "Blue light-emitting diodes with a roughened backside fabricated by wet etching," Applied Physics Letters, vol. 95, 2009, pp. 201102-1-201102-3.

Japanese Examination Report dated Jan. 28, 2014 for Japanese Patent Application No. 2013-526396.

English translation of Korean Examination Report dated Mar. 25, 2014 from corresponding Korean Patent Application No. 10-2013-7008260.

Liao, W.T., "Comparison of the Performance of InGaN/AlGaN MQW LEDs Grown on c-Plane and a-Plane Sapphire Substrates," *Electrochemical and Solid-State Letters*, vol. 10, 2007, pp. H5-H7.

\* cited by examiner

LIGHT-EMITTING DIODE CHIP

RELATED APPLICATIONS

This application is a §371 of International Application No. PCT/EP2011/064185, with an international filing date of Aug. 17, 2011 (WO 2012/028460 A2, published Mar. 8, 2012), which is based on German Patent Application No. 10 2010 036 180.1, filed Sep. 2, 2010, the subject matter of which is incorporated herein by reference.

TECHNICAL FIELD

This disclosure relates to a light-emitting diode chip.

BACKGROUND

There is a need for a light-emitting diode chip which can be produced particularly economically.

SUMMARY

We provide a light-emitting diode chip including a semiconductor body including a radiation-generating active region, at least two contact locations electrically contacting the active region, a carrier, and a connecting medium arranged between the carrier and the semiconductor body, wherein the semiconductor body includes roughening on outer surfaces facing the carrier, the semiconductor body mechanically connects to the carrier by the connecting medium, the connecting medium locally directly contacts the semiconductor body and the carrier, and the at least two contact locations are arranged on the upper side of the semiconductor body facing away from the carrier.

We also provide a light-emitting diode chip including a semiconductor body including a radiation-generating active region, at least two contact locations electrically contacting the active region, a carrier, and a connecting medium arranged between the carrier and the semiconductor body, wherein the semiconductor body includes roughening on its outer surface facing the carrier, the semiconductor body mechanically connects to the carrier by the connecting medium, the connecting medium locally directly contacts the semiconductor body and the carrier, the at least two contact locations are arranged on the upper side of the semiconductor body facing away from the carrier, the connecting medium is an electrically insulating adhesive, the connecting medium is radiation-transmissive, the semiconductor body locally directly contacts the carrier, and the roughening includes elevations and depressions, the connecting medium arranged at least locally in the depressions and peaks of the elevations are at least locally free from connecting medium.

DETAILED DESCRIPTION

Figure 1A:
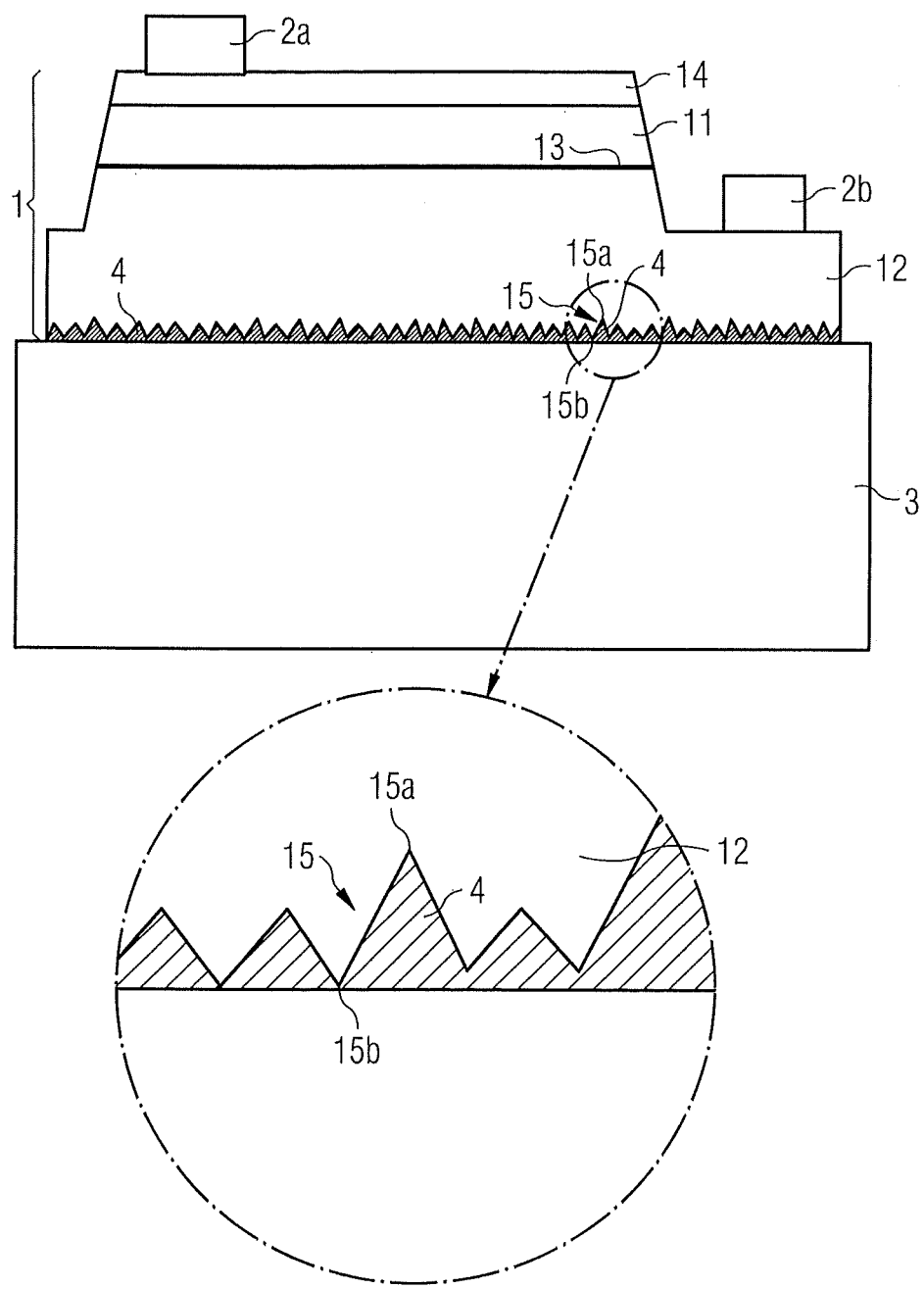
FIGS. 1A, 1B, 1C, 2, 3 and 6 show examples of light-emitting diode chips.

The light-emitting diode chip may comprise a semiconductor body having a radiation-generating region. For example, the semiconductor body comprises an n-type conducting region, a p-type conducting region, and at least one radiation-generating active region arranged between the n-type conducting region and the p-type conducting region. The semiconductor body is in this case based, for example, on a III-V compound semiconductor material.

A III-V compound semiconductor material comprises at least one element from the third main group, for example, B, Al, Ga, In, and one element from the fifth main group, for example, N, P, As. In particular, the term "III-V compound semiconductor material" includes the group of binary, ternary or quaternary compounds that contain at least one element from the third main group and at least one element from the fifth main group, for example, nitride and phosphide compound semiconductors. Such a binary, ternary or quaternary compound may, for example, furthermore comprise one or more dopants as well as additional constituents.

The light-emitting diode chip may comprise at least two contact locations for electrically contacting the active region. For example, the light-emitting diode chip comprises exactly two contact locations. The active region can be contacted on the p-side by one of the contact locations, and the active region can be contacted on the n-side by the other contact location.

The light-emitting diode chip may comprise a carrier. The carrier is not in this case the growth substrate on which the semiconductor body is epitaxially grown, but rather a carrier not connected to the semiconductor body until after production of the semiconductor body. For example, the growth substrate is then fully detached from the semiconductor body. This means that the light-emitting diode chip is then free from a growth substrate. The carrier then fulfills the function of mechanical stabilization in the light-emitting diode chip. This means that the carrier carries the semiconductor body of the light-emitting diode chip such that the former does not break during normal use, for example, when incorporated into a package, or suffer mechanical damage in another way.

A connecting medium may be arranged between the carrier and the semiconductor body. This means that the semiconductor body mechanically connects to the carrier by the connecting medium. For example, the connecting medium locally adjoins the semiconductor body and the carrier directly.

The semiconductor body may comprise roughening on its outer surface that faces the carrier. For example, the outer surface that faces the carrier is the outer surface of the semiconductor body that originally faces the growth substrate of the semiconductor body. This means that the growth substrate is removed from the roughened outer surface of the semiconductor body and the semiconductor body connects on its outer surface that faces the carrier, which comprises roughening, to the carrier by the connecting medium.

The semiconductor body in this case at least mechanically connects to the carrier by the connecting medium, i.e., the connecting medium does not need to establish any electrical connection between the carrier and the semiconductor body, but rather the connecting medium merely ensures that the semiconductor body cannot become detached from the carrier during normal use of the light-emitting diode chip. In particular, it is possible for the connecting medium to be electrically insulating.

The connecting medium may be locally in direct contact with the semiconductor body and the carrier. This means that the semiconductor body and the carrier may be wetted with the connecting medium on the mutually opposing surfaces.

The at least two contact locations may be arranged on the upper side of the semiconductor body that faces away from the carrier. This means that the light-emitting diode chip is preferably contacted from the side facing away from the carrier. It is then not possible for current to flow through the carrier. For example, merely mechanical fastening of the light-emitting diode chip, for example, on a printed circuit board or a lead frame, may take place on the side of the carrier that faces away from the semiconductor body. The electrical contacting then takes place via the at least two contact locations on the upper side of the semiconductor body that faces away from the carrier. Preferably, the contact locations are in this case opposite types of contact locations, i.e., the semiconductor body is contacted on the n- and p-sides from its upper side that faces away from the carrier.

The light-emitting diode chip may comprise a semiconductor body which comprises a radiation-generating active region, at least two contact locations to electrically contact the active region, a carrier, and a connecting medium arranged between the carrier and the semiconductor body. In this case, the semiconductor body comprises roughening on its outer surface that faces the carrier, the semiconductor body mechanically connects to the carrier by the connecting medium, the connecting medium is locally in direct contact with the semiconductor body and the carrier, and the at least two contact locations are arranged on the upper side of the semiconductor body facing away from the carrier.

The connecting medium may be an electrically insulating adhesive. This means that the connecting medium connects the semiconductor body and the carrier mechanically to one another and ensures electrical insulation between the semiconductor body and the carrier. The electrically insulating connecting medium may, for example, then be an adhesive based on silicon dioxide. Epoxides, acrylates or BCB may furthermore be envisioned as electrically insulating adhesives. As an alternative or in addition, it is also possible to use silicone-based or other adhesives so long as they exhibit good thermal conductivity, good bonding to carriers and semiconductor bodies and good radiation stability in relation to the electromagnetic radiation generated in the active region of the light-emitting diode chip. It may furthermore prove advantageous for the adhesive to be transparent or radiation-transmissive.

The connecting medium may be radiation-transmissive. In this case, "radiation-transmissive" means that the connecting medium transmits preferably at least 50%, particularly preferably at least 75% of the electromagnetic radiation generated in the radiation-generating active region of the semiconductor body, which is incident on the connecting medium. For example, it is in this case possible for the connecting medium to be transparent.

The semiconductor body may be locally in direct contact with the carrier. This means that, at some locations in the connecting region between the semiconductor body and the carrier, there is no connecting medium between the semiconductor body and the carrier, but rather the semiconductor and the carrier are in direct contact with one another there. This, for example, allows particularly good thermal dissipation from the semiconductor body to the carrier.

Roughening of the semiconductor body on its outer surface facing the carrier may be formed by elevations and depressions, i.e., the roughening may comprise elevations and depressions. The connecting medium is in this case arranged at least locally in the depressions, while the peaks of the elevations may be locally free from connecting medium. These peaks of the elevations may then be in direct contact with the carrier. In this case, a thickness of the connecting medium layer between the carrier and the semiconductor body of from at least 100 nm to at most 1 µm proves particularly advantageous. The thickness of the connecting medium layer is not necessarily homogeneous. The thickness of the connecting medium layer may vary depending on the depth of the depressions or the height of the elevations.

The carrier may be radiation-transmissive. For a radiation-transmissive carrier, a carrier formed using sapphire or consists of sapphire is, for example, particularly suitable. In particular, the surface of the carrier facing the semiconductor body may be a sapphire a-plane. This means, for example, that the carrier may in particular be so-called "a-plane" sapphire. This proves advantageous for the following reasons: for example, light-emitting diode chips based on GaN are often grown on sapphire as a growth substrate. To obtain a high-quality semiconductor body in this case, the sapphire must generally be oriented in the c-plane. The effect of this, however, is that only about 30% of the original sapphire crystal can be used to produce the growth substrate since a sapphire crystal grows in an "a-plane" direction in a pulling method. On an "a-plane," for example, semiconductor bodies based on GaN cannot however be grown with sufficiently good crystal quality by MOVPE. In the case of a light-emitting diode chip as described here, it is possible to detach and reuse the growth substrate. The substantially more economical "a-plane" sapphire may then be used as a carrier.

The carrier may be radiation-reflecting. To this end, the carrier may consist of a radiation-reflecting material, for example, a metal. It is furthermore possible for the carrier to comprise, on its upper side facing the semiconductor body, a reflective layer formed reflectively to reflect electromagnetic radiation generated in the active region. The reflective layer may, for example, be a metallic layer formed using aluminum and/or silver and/or gold. If a metallic carrier is used, it may, for example, contain aluminum or consist of aluminum. For the reflective layer, it is furthermore possible for it to be a dielectric layer which may, for example, be formed in the manner of a Bragg mirror or a dielectric mirror. Since an electric current preferably does not need to be imposed in the semiconductor body via the carrier, use of an electrically insulating reflective layer is possible.

The carrier may be formed to be radiation-scattering. This means that electromagnetic radiation incident on the carrier and/or entering the carrier generated in the radiation-generating active region, is scattered. To this end, for example, the carrier may be formed using a scattering ceramic material. For example, this may be sintered $Al_2O_3$ or sintered AlN. The output of light from the light-emitting diode chip is in this case achieved in part by absorption-free scattering.

Regions of the outer surface of the carrier not covered by the semiconductor body may be covered with a radiation-reflecting layer, the layer being formed reflectively to reflect electromagnetic radiation generated in the active region. For example, the radiation-reflecting layer may be a dielectric layer with which the free outer surface of the carrier is mirrored. If it is then, for example, a radiation-transmissive carrier, the electromagnetic radiation incident on the outer surfaces of the carrier will be reflected until it leaves the light-emitting diode chip through the semiconductor body. At the roughened interface between the semiconductor body and the carrier, the likelihood of total reflection is reduced owing to the roughening so that the electromagnetic radiation generated in the active region can emerge with high efficiency from the semiconductor body.

The electrical contacting may be carried out exclusively from the upper side of the semiconductor body facing away from the carrier. This means that all contact locations necessary for the electrical contacting are arranged on the upper side of the semiconductor body facing away from the carrier. No current provided to energize the active region flows through the carrier.

The light-emitting diode chip may comprise at least two semiconductor bodies, each semiconductor body comprising a radiation-generating active region. The semiconductor bodies are in this case separated from one another such that the radiation-generating active regions are not continuous with one another and, for example, can be operated separately from one another. The semiconductor bodies of the light-emitting diode chip are preferably electrically connected in parallel and/or in series with one another. This may, for example, be achieved by a connecting layer which may be arranged on the side of the semiconductor body facing away from the carrier. For example, the connecting layer connects two contact locations, which are of opposite types, of neighboring semiconductor bodies.

In this way, a light-emitting diode chip is produced which may comprise a multiplicity of pixels and, for example, in the case of series connection, may be used as a so-called "high-voltage light-emitting diode chip." This means that the light-emitting diode chip can be operated directly with a voltage of, for example, at least 8 V, preferably at least 50 V, for example, with a mains voltage of 110 V or 230 V. The light-emitting diode chip may in this case also comprise a rectifier circuit and/or at least one ballast resistor, which may likewise be arranged on the carrier of the light-emitting diode chip.

The side of the semiconductor body facing the carrier may comprise an n-type conducting semiconductor material. In other words, the n-type conducting region of the semiconductor body faces the carrier. At least one through-contact then extends from the side facing away from the carrier, from one of the at least two contact locations, through the active region to the n-type conducting semiconductor material. The through-contact may in this case be enclosed circumferentially by the semiconductor material of the semiconductor body.

The light-emitting diode chip as described here will be explained in more detail below with the aid of examples and the associated figures.

Elements which are the same or of the same type, or which have the same effect, are provided with the same references in the figures. The figures and the size proportions of the elements represented in the figures with respect to one another are not to be regarded as true to scale. Rather, individual elements may be represented exaggeratedly large for better representability and/or better understanding.

FIG. 1A shows a schematic sectional representation of an example of a light-emitting diode chip as described here. The light-emitting diode chip comprises a semiconductor body 1. The semiconductor body 1 has a p-type conducting region 11, an n-type conducting region 12, and an active region 13 which lies between the p-type conducting region 11 and the n-type conducting region 12. During operation of the light-emitting diode chip, electromagnetic radiation, for example, in a wavelength range of from UV radiation to infrared radiation, is generated in the active region 13.

The light-emitting diode chip furthermore has two contact locations 2a, 2b, by which the active region 13 is electrically contacted from its p-type side and its n-type side, respectively. Between the p-type conducting region 11 and the p-type contact location 2a, a contact layer 14 may be arranged which is used, for example, for current expansion. For example, it is possible for the contact layer to be formed using a transparent conductive oxide (TCO) such as ITO or ZNO.

As can be seen from FIG. 1A, in the light-emitting diode chips as described here, the n-type conducting region is preferably roughened on its outer surface. This means that the n-type conducting region comprises roughenings 15. The roughenings 15 are in this case preferably configured such that electromagnetic radiation generated in the active region is refracted at facets of the roughenings.

The roughenings 15 comprise depressions 15a and elevations 15b. The roughenings preferably have depths of at least 1 μm to at most 2 μm. In this case, the depth is, for example, the distance between the deepest point of a depression 15a and the peak of a neighboring elevation 15b. The flank angle of the roughenings is preferably at least 45° and at most 60°.

The light-emitting diode chip furthermore comprises a carrier 3. The carrier 3 is mechanically fastened to the semiconductor body 1 on the outer surface of the n-type conducting region provided with the roughenings 15. The surface of the n-type conducting region 12 that comprises the roughenings 15 is preferably a surface from which the growth substrate 9 has been detached (cf., e.g., FIG. 4A).

For mechanical connection between the carrier 3 and the semiconductor body 1, a connecting medium 4 is arranged between the two elements. The connecting medium 4 is formed, for example, by a radiation-transmissive adhesive. The connecting medium 4 is arranged at least in the depressions 15a of the roughening 15. Peaks of the elevations 15b may protrude from the connecting medium 4 and are then in direct contact with the carrier 3. This means that the connecting medium 4 is preferably in direct contact with the semiconductor body 1 and the carrier 3, and it is possible for the semiconductor body 1 to be in direct contact with the carrier 3 on the upper side of the n-type conducting region 12 that faces the carrier.

The connecting medium 4, i.e., for example, the adhesive is, for example, applied by spin coating which permits particularly high homogeneity of the distribution of the connecting medium. The layer of the connecting medium 4 is in this way, for example, essentially free from air inclusions.

In the example of FIG. 1A, the carrier is, for example, a radiation-transmissive transparent carrier formed by a-plane sapphire or consists of a-plane sapphire. The connecting medium is then preferably a transparent adhesive.

Figure 1B:
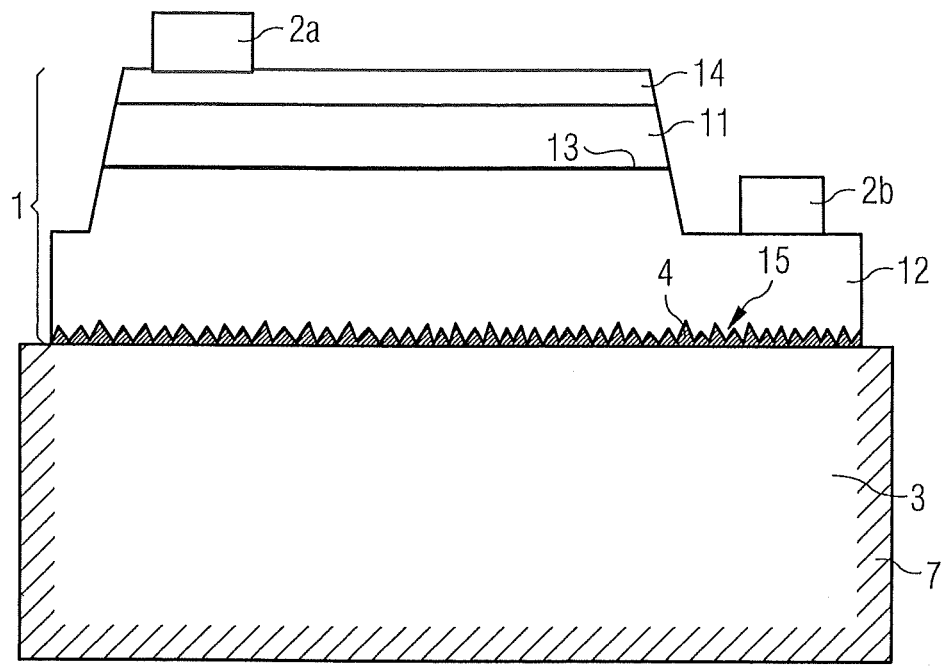

Another example of a light-emitting diode chip as described here will be explained in more detail in connection with FIG. 1B. In contrast to the example of FIG. 1A, the carrier 3 has a radiation-reflecting layer 7 on its free outer surface, which layer is formed, for example, by a dielectric coating of the carrier. Electromagnetic radiation generated in the active region 13, which enters the carrier 3, is reflected by this layer in the direction of the semiconductor body 1. A surface emitter is obtained, in which almost all of the electromagnetic radiation emitted by the light-emitting diode chip during operation emerges through the upper side of the semiconductor body 1 that faces away from the carrier 3.

Figure 1C:
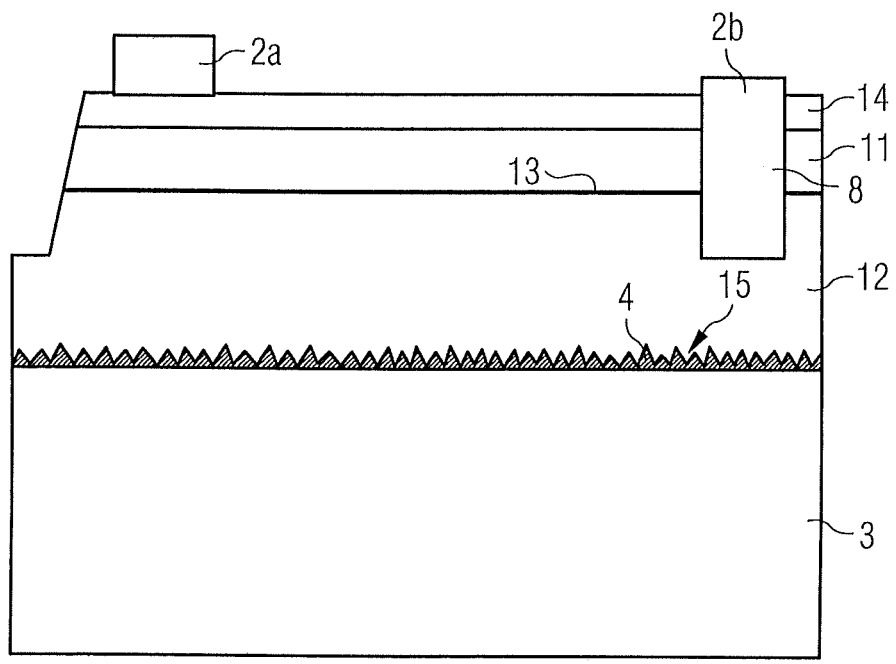

Another example of a light-emitting diode chip as described here will be explained in more detail in connection with FIG. 1C. In this example, the semiconductor body 1 comprises a through-contact 8 which extends from the upper side of the semiconductor body 1 that faces away from the carrier 3 to the n-type conducting region 12, the through-contact 8 passing through both the p-type conducting region 11 and the active region 13. The through-contact 8 may, for example, be formed by a hole in the semiconductor body, which is coated with an electrically insulating material on its side surfaces. The remaining hole is then filled with an electrically conductive material, for example, a conductive adhesive or a metal electrically conductively connected to the n-type contact location 2b.

Figure 2:
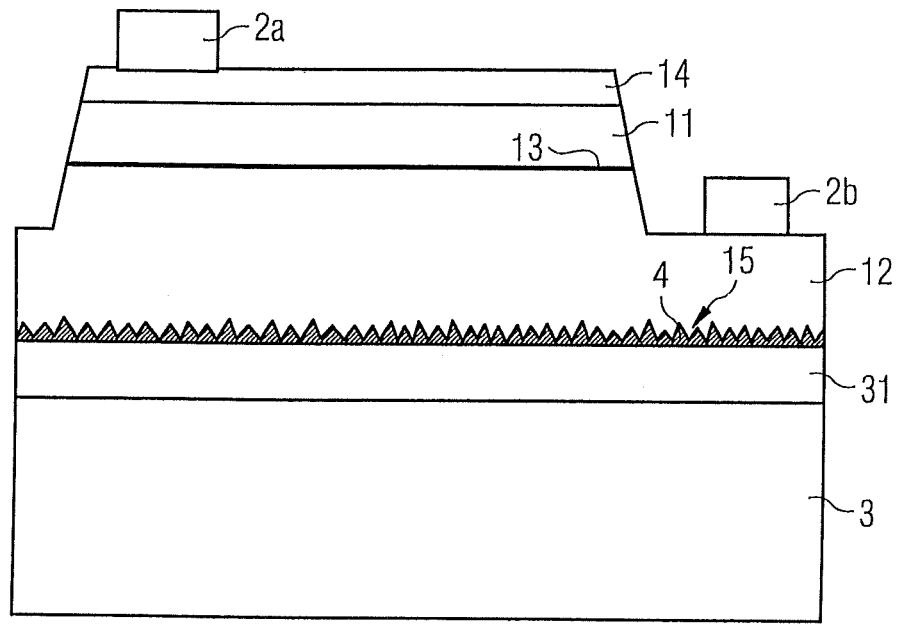

Another example of a light-emitting diode chip as described here will be explained in more detail in connection with FIG. 2. In contrast to the examples of FIGS. 1A to 1C, the carrier in this case has a reflective layer 31 on its side that faces the semiconductor body 1. The reflective layer 31 may be formed dielectrically and/or metallically. For example, it may be a layer which contains silver or consists of silver. In this case, the reflective layer 31 is not subjected to an electric field since the light-emitting diode chip is energized exclusively from its side that faces away from the carrier 3, via the contact locations 2a, 2b. An advantage obtained in this case is that a metal susceptible to electron migration under the effect of moisture such as silver can be used without risk to the light-emitting diode chip. An advantageous surface emitter is obtained in which a majority of the radiation emitted by the light-emitting diode chip during operation is output through the upper side of the semiconductor body 1 facing away from the carrier 3.

Figure 3:
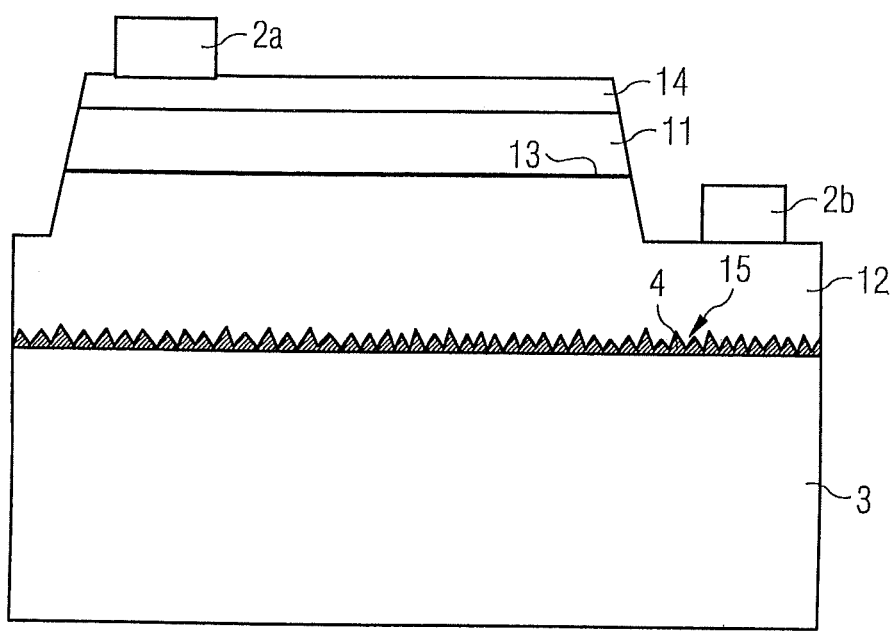

Another example of a light-emitting diode chip as described here will be explained in more detail in connection with FIG. 3 with the aid of a schematic sectional representation. In this example, the carrier 3 is formed to be light-scattering. To this end, the carrier 3 consists, for example, of a ceramic material such as sintered $Al_2O_3$. The connecting medium 4 may be formed so as to be radiation-transmissive or radiation-scattering.

The radiation scattering at the carrier 3 in this case takes place without losses which makes a light-emitting diode chip possible that emits predominantly through its upper side of the semiconductor body 1 that faces away from the carrier 3, with no reflection losses occurring at the carrier 3.

A first method of producing a light-emitting diode chip as described here will be explained in more detail in connection with the schematic sectional representations of FIGS. 4A to 4E.

Figure 4A:
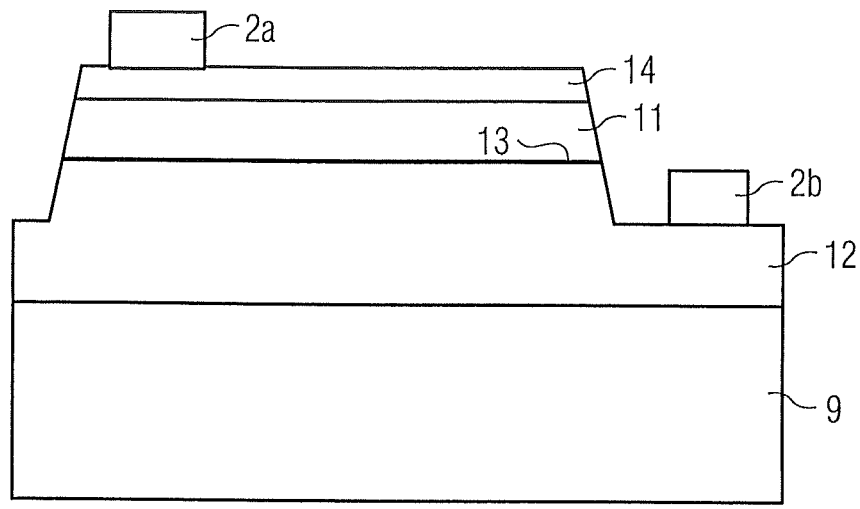
FIGS. 4A, 4B, 4C, 4D, 4E, 5A, 5B, 5C, 5D and 5E show methods of producing light-emitting diode chips.

In a first method step, FIG. 4A, a light-emitting diode chip is provided, for example, in a wafer assembly, the semiconductor body 1 still being applied onto the growth substrate 9 on which the semiconductor layers of the semiconductor body 1 are epitaxially deposited. The light-emitting diode chip is already contacted ready for operation.

Figure 4B:
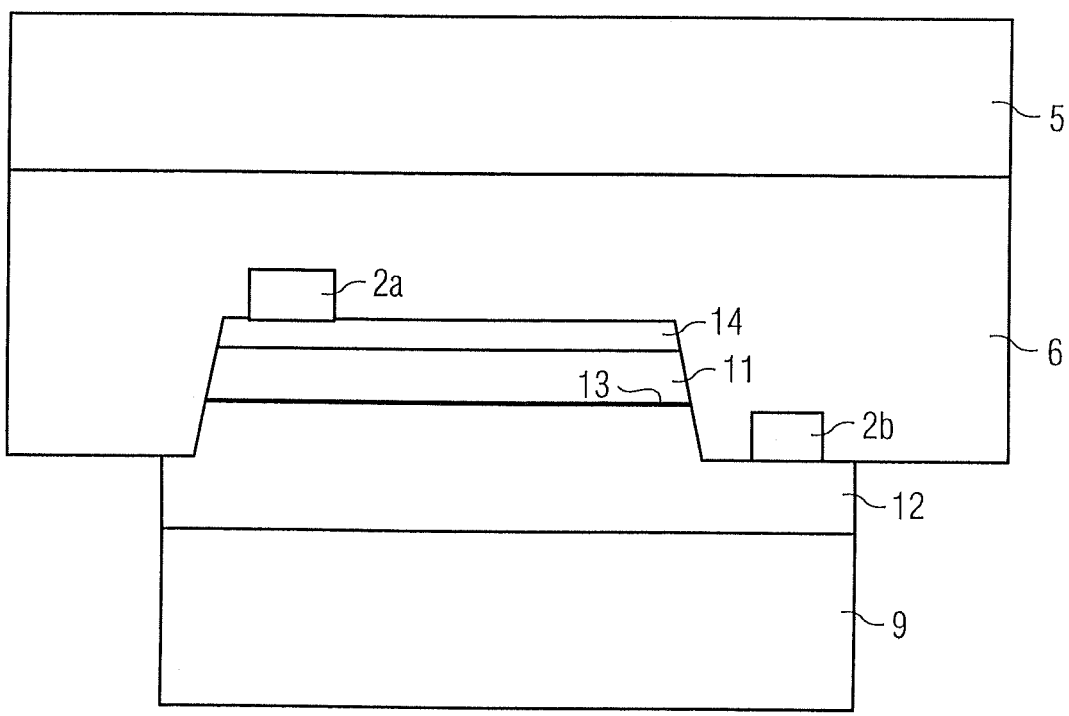

In a next method step, FIG. 4B, the light-emitting diode chip connects to a temporary carrier 5 by a further connecting medium, for example, an adhesive. The temporary carrier 5 is selected such that it provides sufficient stability for detachment of the growth substrate 9.

Figure 4C:
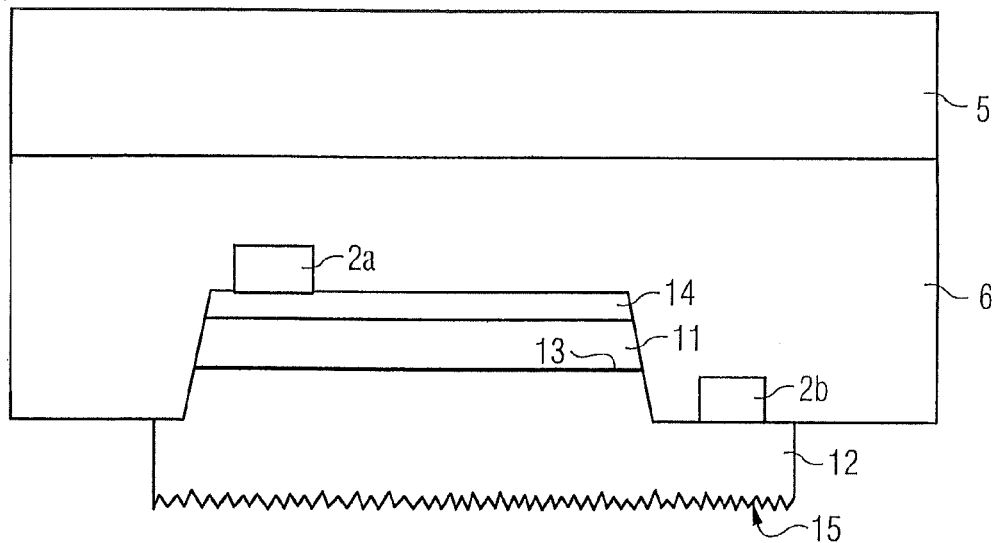

In a next method step, FIG. 4C, the growth substrate 9 is detached from the semiconductor body 1, for example, by a laser lift-off method. At the same time or subsequently, the roughening 15 may be generated on the side of the n-type conducting region 12 that faces the growth substrate 9 originally present. For example, the roughening is generated by etching (for example, with hot KOH).

Figure 4D:
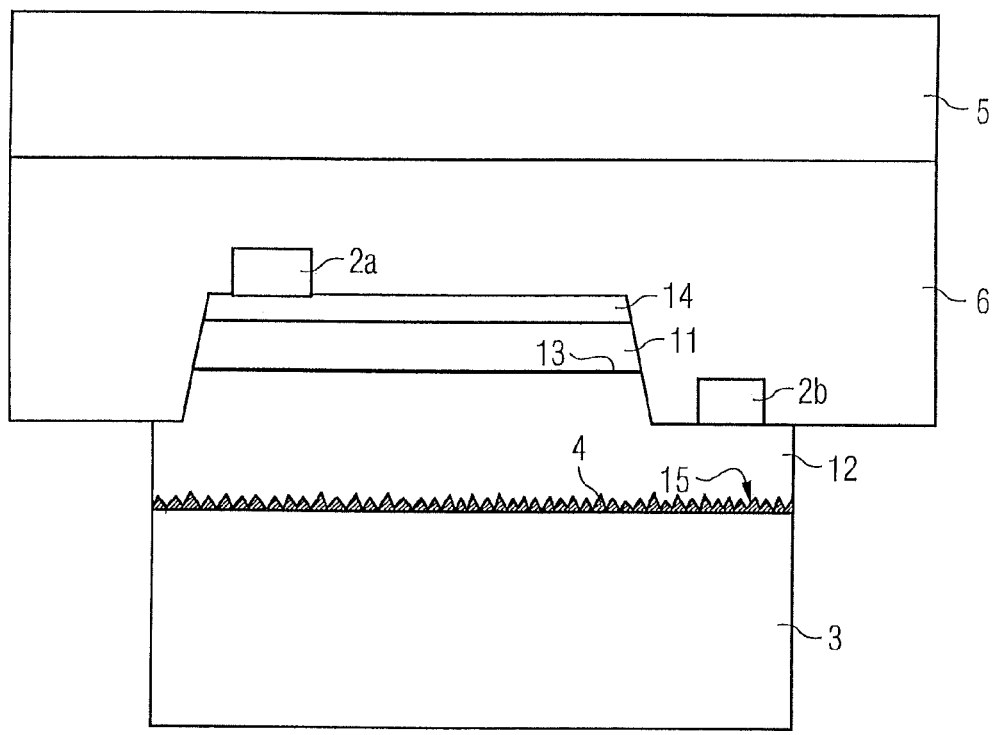

In a further method step, FIG. 4D, the carrier 3 connects to the semiconductor body 1 by the connecting medium 4.

Figure 4E:
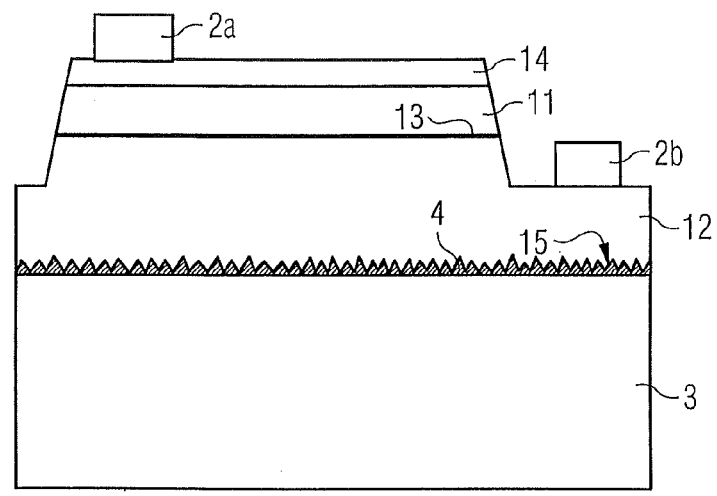

In final method steps, FIG. 4E, the temporary carrier 5 is removed and the wafer assembly can be divided into individual light-emitting diode chips.

An alternative production method for light-emitting diode chips as described here will be explained in connection with FIGS. 5A, 5B, 5C, 5D and 5E.

In this variant of the production method, a light-emitting diode chip structure comprising a growth substrate 9, an n-type conducting region 12, an active region 13 and a p-type conducting region 11 is provided first. This structure may, for example, be in the form of a wafer assembly. A temporary carrier 5 is applied onto this structure by a further connecting medium 6, in this case, for example, a solder, FIG. 5A.

Figure 5A:
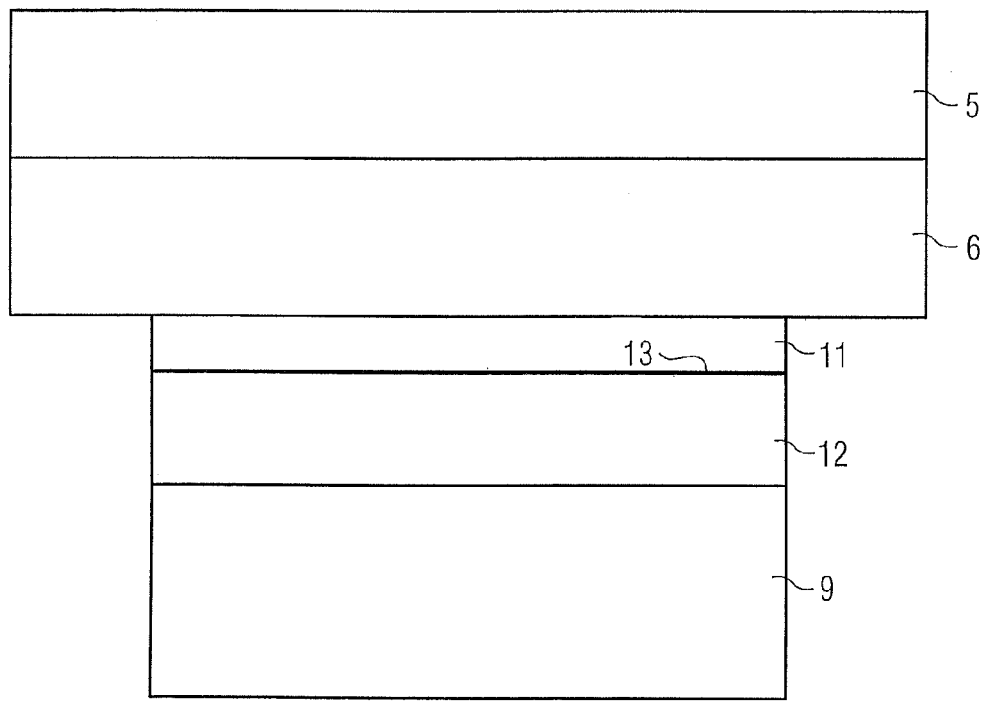
Figure 5B:
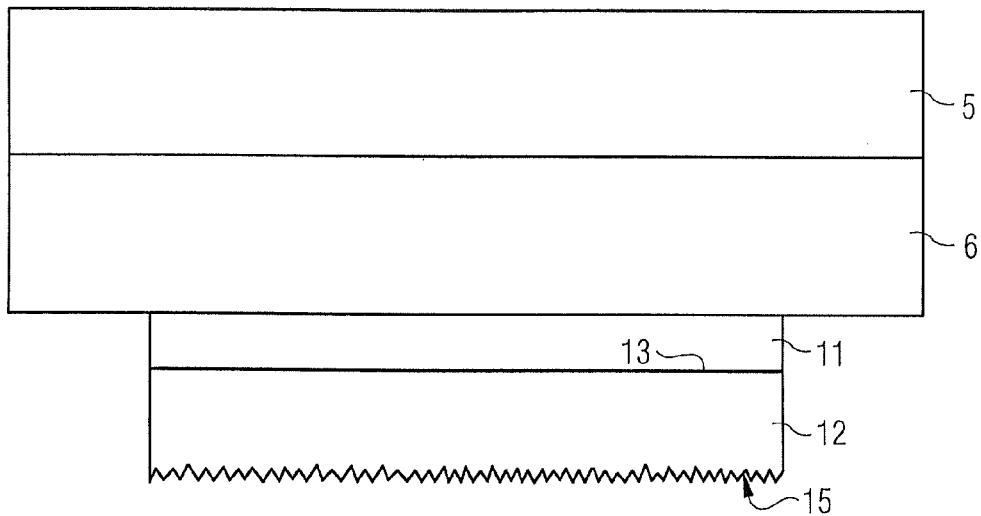

In a next method step, FIG. 5B, the growth substrate is detached, for example, by laser lift-off, and the roughening 15 is produced on the side of the n-type conducting region 12 of the semiconductor body 1 facing away from the temporary carrier 5.

Figure 5C:
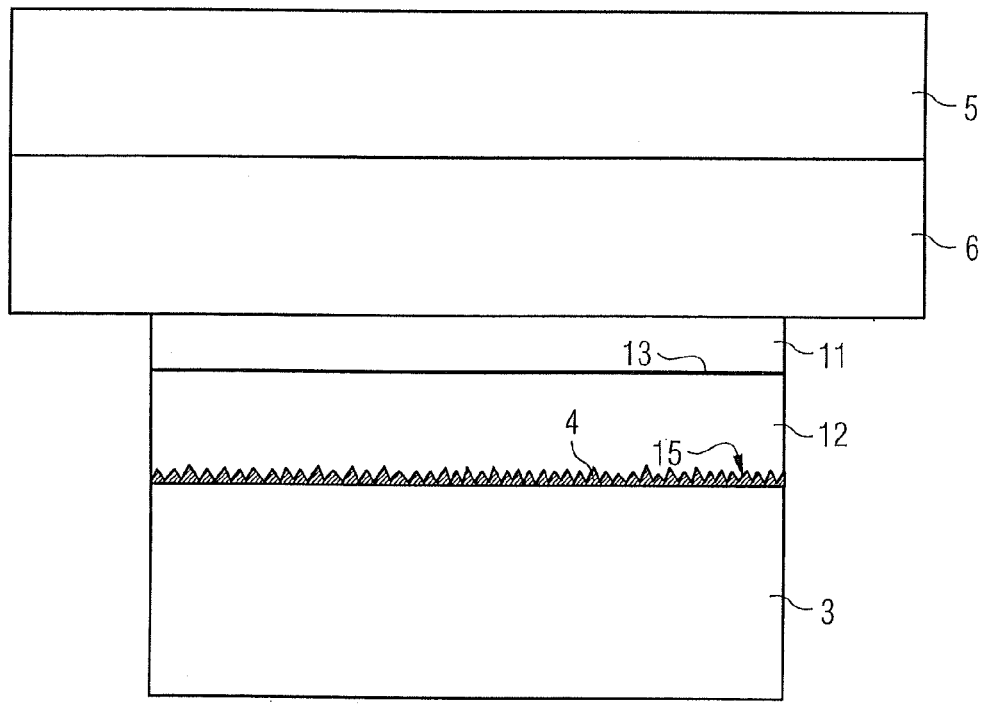

In a next method step, FIG. 5C, the structure connects to the carrier 3 by the connecting medium 4.

Figure 5D:
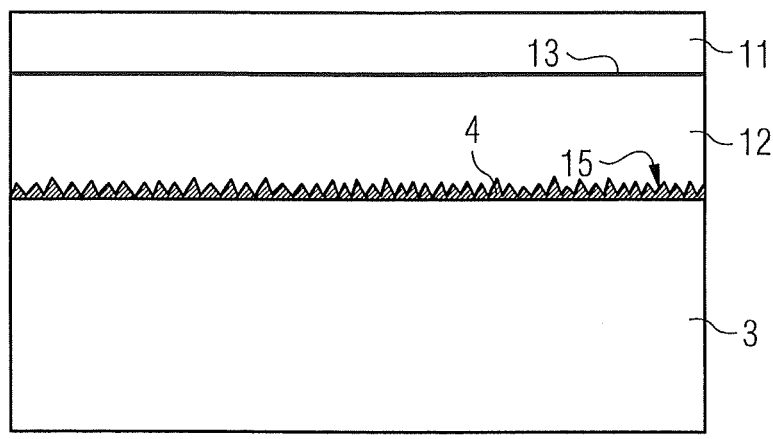

Subsequently, FIG. 5D, the temporary carrier 5 is removed.

Figure 5E:
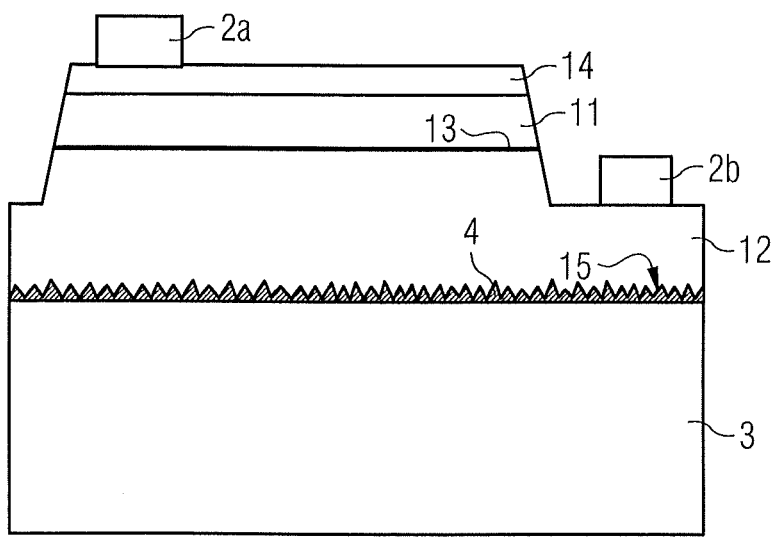

In final method steps, FIG. 5E, the electrical contacting is carried out by applying the contact locations 2a, 2b and optionally the contact layer 14, and separation into individual light-emitting diode chips is carried out.

Figure 6:
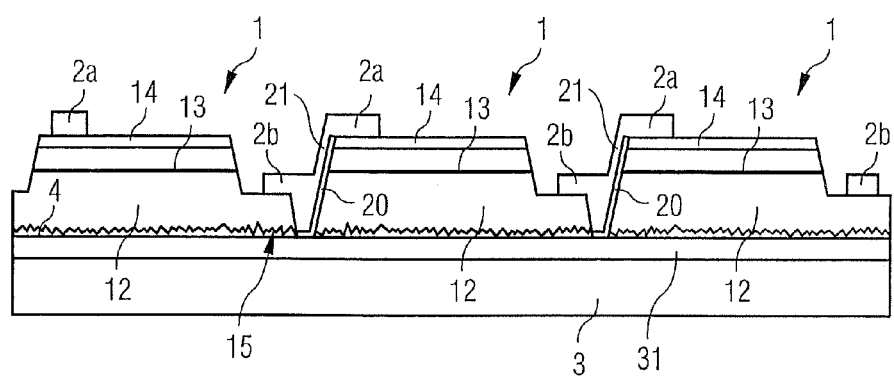

A further example of a light-emitting diode chip as described here will be explained in more detail with the aid of FIG. 6 by a schematic sectional representation. In contrast, e.g., to the example of FIG. 2, the light-emitting diode chip comprises a multiplicity of semiconductor bodies 1. The semiconductor bodies 2 are arranged next to one another on the carrier 3. This carrier 3 may be selected as shown in one of FIG. 1A, 1B, 1C, 2 or 3.

Neighboring semiconductor bodies 1 connect in series with one another. For example, all the semiconductor bodies 1 connect in series. To this end, contact locations 2a, 2b, which are of opposite types, of neighboring semiconductor bodies electrically conductively connect to one another by the connecting layer 21. The connecting layer 21 consists, for example, of a metal or a transparent conductive oxide. For example, the connecting layer 21 is formed from the same material as the contact locations 2a, 2b.

So that the connecting layer 21 cannot short circuit the respective semiconductor bodies at their respective active region 13, a passivation layer 20 is respectively provided between the semiconductor body and the connecting layer. The passivation layer 20 may, for example, be formed by a layer of silicon dioxide.

Overall, a light-emitting diode chip having many pixels can be produced in this way. In this case, the light-emitting diode chip forms a high-voltage light-emitting diode chip which may be operated with voltages of, for example, more than 8 V.

Our chips and methods are not restricted by the description with the aid of the examples. Rather, this disclosure covers any new feature and any combination of features, which includes in particular any combination of features in the appended claims, even if the feature or combination is not explicitly indicated per se in the claims or examples.

The invention claimed is:

1. A light-emitting diode chip comprising:
   a semiconductor body having a radiation-generating active region,
   at least two contact locations electrically contacting the active region,
   a carrier, and
   a connecting medium arranged between the carrier and the semiconductor body, wherein
   the semiconductor body comprises a roughening on outer surfaces facing the carrier,
   the semiconductor body mechanically connects to the carrier by the connecting medium,
   the connecting medium locally directly contacts the semiconductor body and the carrier, the at least two contact locations are arranged on the upper side of the semiconductor body facing away from the carrier, the roughening is arranged between the semiconductor body and the carrier, the roughening comprises elevations and depressions in the material comprising the semiconductor body, wherein at least some of the elevations completely reach through the connection medium, and peaks of the elevations protrude from the connecting medium, said protruding peaks being free of the connecting medium and in direct physical contact with the carrier.

2. The light-emitting diode chip according to claim 1, wherein the carrier is radiation-transmissive, the upper side of the carrier facing the semiconductor body is a sapphire a-plane, the connecting medium is an electrically insulating adhesive, the connecting medium is radiation-transmissive, the semiconductor body locally directly contacts the carrier, and the roughening comprises elevations and depressions, the connecting medium arranged at least locally in the depressions and peaks of the elevations are at least locally free from connecting medium.

3. The light-emitting diode chip according to claim 1, wherein the connecting medium is an electrically insulating adhesive, the connecting medium is radiation-transmissive, the semiconductor body locally directly contacts the carrier, and the roughening comprises elevations and depressions, the connecting medium arranged at least locally in the depressions and peaks of the elevations are at least locally free from connecting medium.

4. The light-emitting diode chip according to claim 1, wherein the carrier is radiation-transmissive.

5. The light-emitting diode chip according to claim 1, wherein the upper side of the carrier facing the semiconductor body is a sapphire a-plane.

6. The light-emitting diode chip according to claim 1, wherein the carrier is radiation-reflecting.

7. The light-emitting diode chip according to claim 1, wherein the carrier comprises, on its upper side facing the semiconductor body, a reflective layer formed reflectively to reflect electromagnetic radiation generated in the active region.

8. The light-emitting diode chip according to claim 1, wherein the carrier comprises a metallic material.

9. The light-emitting diode chip according to claim 1, wherein the carrier is radiation-scattering.

10. The light-emitting diode chip according to claim 1, wherein the carrier comprises a ceramic material.

11. The light-emitting diode chip according to claim 1, wherein regions of the outer surface of the carrier not covered by the semiconductor body are covered with a further radiation-reflecting layer, the radiation-reflecting layer formed reflectively to reflect electromagnetic radiation generated in the active region.

12. The light-emitting diode chip according to claim 1, having at least two semiconductor bodies, each semiconductor body comprising a radiation-generating active region, and the semiconductor bodies connected in parallel and/or in series with one another.

13. The light-emitting diode chip according to claim 1, wherein the side of the semiconductor body facing the carrier comprises an n-type conducting semiconductor material, and at least one through-contact extends from the side facing away from the carrier, from one of the at least two contact locations, through the active region to the n-type conducting semiconductor material.

14. A light-emitting diode chip comprising:

a semiconductor body comprising a radiation-generating active region, at least two contact locations electrically contacting the active region, a carrier, and a connecting medium arranged between the carrier and the semiconductor body, wherein the semiconductor body comprises a roughening on its outer surfaces facing the carrier, the semiconductor body mechanically connects to the carrier by the connecting medium, the connecting medium locally directly contacts the semiconductor body and the carrier, the at least two contact locations are arranged on the upper side of the semiconductor body facing away from the carrier, the connecting medium is an electrically insulating adhesive, the connecting medium is radiation-transmissive, the semiconductor body locally directly contacts the carrier, the roughening comprises elevations and depressions in the material comprising the semiconductor body, wherein at least some of the elevations completely reach through the connection medium, the connecting medium arranged at least locally in the depressions and peaks of the elevations are at least locally free from connecting medium, the roughening is arranged between the semiconductor body and the carrier, and peaks of the elevations protrude from the connecting medium, said protruding peaks being free of the connecting medium and in direct contact with the carrier.

15. The light-emitting diode chip according to claim 1, wherein side faces of the elevations which completely reach through the connecting medium are covered by the connecting medium.

16. The light-emitting diode chip according to claim 14, wherein side faces of the elevations which completely reach through the connecting medium are covered by the connecting medium.

17. The light-emitting diode chip according to claim 1, wherein parts of the semiconductor body are arranged between the connecting medium and the carrier.

18. The light-emitting diode chip according to claim 14, wherein parts of the semiconductor body are arranged between the connecting medium and the carrier.

19. The light-emitting diode chip according to claim 1, wherein the reflective layer is not subject to an electric field.

* * * * *